(12) United States Patent
Brown

(10) Patent No.: US 10,469,782 B2
(45) Date of Patent: Nov. 5, 2019

(54) POWER-CONSERVING CLOCKING FOR SCANNING SENSORS

(71) Applicant: KLA-Tencor Corporation, Milpitas, CA (US)

(72) Inventor: David L. Brown, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 111 days.

(21) Appl. No.: 15/713,003

(22) Filed: Sep. 22, 2017

(65) Prior Publication Data

US 2018/0091751 A1    Mar. 29, 2018

Related U.S. Application Data

(60) Provisional application No. 62/400,221, filed on Sep. 27, 2016.

(51) Int. Cl.
*H04N 5/372* (2011.01)
*H04N 5/369* (2011.01)
(Continued)

(52) U.S. Cl.
CPC .......... *H04N 5/372* (2013.01); *G02B 21/245* (2013.01); *G02B 26/128* (2013.01); *H01L 27/14856* (2013.01); *H04N 5/3698* (2013.01); *H04N 5/3725* (2013.01); *H04N 5/3765* (2013.01); *H04N 5/37206* (2013.01); *H04N 5/37213* (2013.01); *H04N 2201/04782* (2013.01); *H04N 2201/04784* (2013.01)

(58) Field of Classification Search
CPC ....... H04N 5/3698; H04N 5/372–3728; H04N 3/1525–1543
See application file for complete search history.

(56) References Cited

U.S. PATENT DOCUMENTS 6,020,957 A  *  2/2000  Rosengaus ......... G01N 21/9501
                                                      356/237.4
7,609,309 B2    10/2009  Brown et al.
(Continued)

FOREIGN PATENT DOCUMENTS

KR    20120089746 A    8/2012

OTHER PUBLICATIONS

International Search Report dated Jan. 5, 2018 for PCT/US2017/053531.

*Primary Examiner* — Paul M Berardesca
(74) *Attorney, Agent, or Firm* — Suiter Swantz pc llo

(57) ABSTRACT

A time delay and integration charge coupled device includes an array of pixels and a clock generator. The array of pixels is distributed in a scan direction and a line direction perpendicular to the scan direction in which at least some of the pixels of the array include three or more gates aligned in the scan direction. The clock generator provides clocking signals to transfer charge along the scan direction between two or more pixel groups including two or more pixels adjacent in the scan direction. The clocking signals include phase signals to transfer the charge to an adjacent pixel group along the scan direction at a rate corresponding to the velocity of the target by driving the gates of the two or more pixel groups and generating a common potential well per pixel group for containing charge generated in response to incident illumination.

37 Claims, 12 Drawing Sheets

(51) Int. Cl.
*H01L 27/148* (2006.01)
*H04N 5/3725* (2011.01)
*H04N 5/376* (2011.01)
*G02B 26/12* (2006.01)
*G02B 21/24* (2006.01)

(56) References Cited

U.S. PATENT DOCUMENTS

| | | |
|---|---|---|
| 8,748,828 B2 | 6/2014 | Brown et al. |
| 2005/0190275 A1* | 9/2005 | Higashitsutsumi .. H04N 5/3725 348/294 |
| 2005/0224842 A1 | 10/2005 | Toyama |
| 2007/0064135 A1 | 3/2007 | Brown et al. |
| 2013/0057739 A1 | 3/2013 | Lazovsky et al. |
| 2014/0217476 A1 | 8/2014 | Conakado et al. |
| 2016/0097727 A1 | 4/2016 | Vazhaeparambil et al. |
| 2017/0370769 A1* | 12/2017 | Asano .................. G01S 7/486 |

\* cited by examiner

POWER-CONSERVING CLOCKING FOR SCANNING SENSORS

CROSS-REFERENCE TO RELATED APPLICATION

The present application claims the benefit under 35 U.S.C. § 119(e) of U.S. Provisional Application Ser. No. 62/400,221, filed Sep. 27, 2016, entitled METHOD FOR REDUCING THE POWER DISSIPATION OF A HIGH-SPEED SCANNING SENSOR, naming David Brown as inventor, which is incorporated herein by reference in the entirety.

TECHNICAL FIELD

The present disclosure relates generally to charge coupled devices and, more particularly, to clocking of charge coupled devices.

BACKGROUND

Charge coupled devices (CCDs) typically include an array of pixels in which each pixel includes multiple voltage-controllable gates for defining potential wells suitable for storing charge generated in response to incident illumination. Charge stored in the potential wells may then be transferred out of the pixel array through clocking signals designed to shift the locations of potential wells through the pixel array towards an output amplifier for generating an output signal representative of the incident illumination. However, the charge transfer operation may require significant power consumption due to capacitance of the gates as well as other factors, which may present design challenges for high-speed CCD devices. Therefore, it may be desirable to provide systems and methods for curing the deficiencies described above.

SUMMARY

A time delay and integration charge coupled device is disclosed in accordance with one or more illustrative embodiments of the present disclosure. In one illustrative embodiment, the charge-coupled device includes an array of pixels distributed in a scan direction and a line direction perpendicular to the scan direction. In another illustrative embodiment, at least some of the pixels of the array include three or more gates aligned in the scan direction. In another illustrative embodiment, the charge-coupled device includes a clock generator configured to generate clocking signals to transfer charge along the scan direction between two or more pixel groups adjacent in the scan direction. In another illustrative embodiment, a pixel group of the pixel groups includes two or more pixels adjacent in the scan direction. In another illustrative embodiment, the clocking signals include phase signals to drive the gates of the two or more pixel groups. In another illustrative embodiment, the clocking signals generate a common potential well per pixel group for containing charge generated in response to incident illumination. In another illustrative embodiment, the clocking signals transfer the charge to an adjacent pixel group along the scan direction at a rate corresponding to the velocity of the target.

An imaging system is disclosed in accordance with one or more illustrative embodiments of the present disclosure. In one illustrative embodiment, the imaging system includes an illumination source configured to generate an illumination beam. In another illustrative embodiment, the imaging system includes a sample translation device to translate a target object along a scan direction. In another illustrative embodiment, the imaging system includes a set of illumination optics to direct the illumination beam to the target object disposed on the sample translation device. In another illustrative embodiment, the imaging system includes a time delay and integration detector. In another illustrative embodiment, the detector includes an array of pixels distributed in a scan direction and a line direction perpendicular to the scan direction. In another illustrative embodiment, the imaging system includes a clock generator to generate clocking signals to transfer charge along the scan direction between two or more pixel groups adjacent in the scan direction in which a pixel group of the pixel groups includes two or more pixels adjacent in the scan direction. In another illustrative embodiment, the clocking signals include phase signals to drive the gates of the two or more pixel groups. In another illustrative embodiment, the clocking signals generate a common potential well per pixel group for containing charge generated in response to incident illumination. In another illustrative embodiment, the clocking signals transfer the charge to an adjacent pixel group along the scan direction at a rate corresponding to the velocity of the target. In another illustrative embodiment, the imaging system includes a set of collection optics configured to generate an image of the target object on the detector in response to the incident illumination beam. In another illustrative embodiment, the imaging system includes a controller communicatively coupled to the detector and the sample translation device, the controller including one or more processors configured to execute instructions configured to cause the one or more processors to synchronize the transfer of charge along the scan direction in the detector with motion of the target object along the scan direction.

An imaging method is disclosed in accordance with one or more illustrative embodiments of the present disclosure. In one illustrative embodiment, the method includes exposing an array of pixels distributed in a scan direction and a line direction perpendicular to the scan direction with illumination associated with a target travelling along the scan direction at a selected velocity in which at least some of the pixels of the array include three or more gates aligned in the scan direction. In another illustrative embodiment, the method includes generating clocking signals to transfer charge along the scan direction between pixel groups adjacent in the scan direction in which the pixel groups include two or more pixels adjacent in the scan direction. In another illustrative embodiment, the clocking signals include phase signals to drive the gates of the two or more pixels of the pixel groups. In another illustrative embodiment, the clocking signals generate a common potential well per pixel group for containing charge generated in response to the illumination. In another illustrative embodiment, the clocking signals transfer the charge to an adjacent pixel group along the scan direction at a rate corresponding to the velocity of the target.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
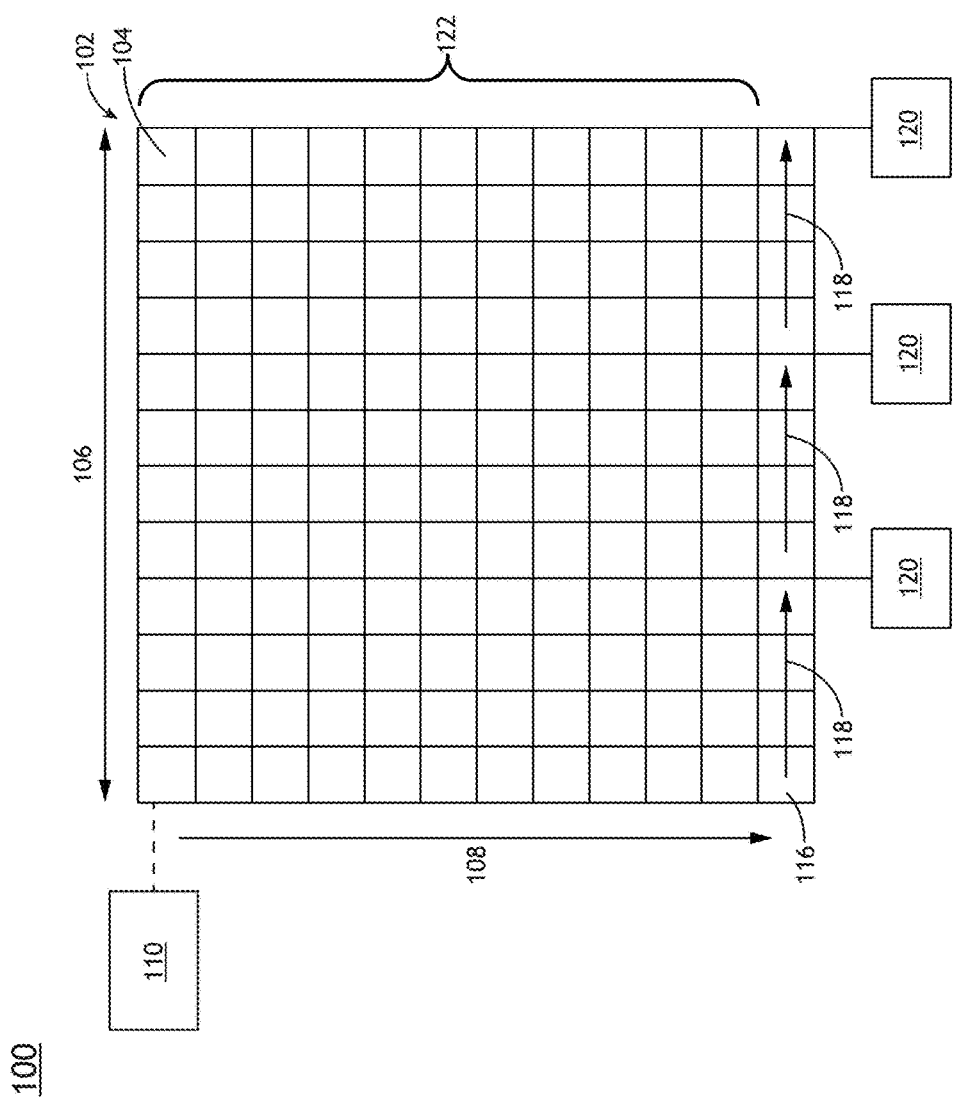
FIG. 1A is a conceptual view of a TDI sensor, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to power-efficient clocking schemes of time delay and integration (TDI) CCD devices. TDI devices typically generate images of a moving object by transferring and integrating charge associated with line images at a speed synchronized with the object movement. In this regard, TDI sensors may provide a continuous stream of line images with relatively high integration times. However, power consumption and associated heat dissipation associated with continual charge transfer operations associated with TDI imaging may impact device design and performance. For example, power consumption and heat dissipation associated with a desired operation speed and pixel geometry may impact electrical drive circuit power requirements, packaging complexity, cooling system requirements, and the like. Embodiments of the present disclosure are directed to power-efficient clocking schemes for controlling charge transfer along the direction of object motion (e.g., a scan direction). Power-efficient clocking schemes may thus facilitate efficient operation of high-speed TDI sensors.

A TDI sensor may include an array of pixels, each having multiple (e.g., three or more) voltage-controllable gates suitable for controlling the charge storage capacity in one or more material layers below or otherwise proximate to the gates. For example, applying a voltage to a pixel gate may provide a local potential well suitable for charge storage. TDI sensors are generally described in U.S. Pat. No. 7,609,309 titled "Continuous clocking of TDI sensors" issued on Oct. 27, 2009 and U.S. Pat. No. 8,748,828 titled "Interposer based imaging sensor for high-speed image acquisition and inspection systems" issued on Jun. 10, 2014, both of which are incorporated herein by reference in their entirety. A TDI sensor may further include a clock generator for providing clocking signals to control the voltage of the pixel gates. In this regard, the distribution of charge throughout individual pixels as well as the pixel array may be controlled based on the voltages applied to the pixel gates by the clocking signals.

Pixels of the pixel array may include any number of gates suitable for controlling the collection and transfer of charge. For example, pixels may typically include, but are not limited to, three or four gates. In this regard, the voltages applied to the gates may be varied in a wide range of combinations to provide flexibility in the electrical properties of the pixel such as, but not limited to the physical size of a generated potential well or a slope associated with potential barriers defining the potential well. Further, pixels may be configured without a potential well suitable for charge storage if desired.

In some pixel designs, a positive applied voltage may provide a local potential well. Accordingly, charge generated in response to illumination incident on the pixel may be, but is not required to be, captured and stored by the pixel by applying a positive voltage to one or more pixel gates. However, it is recognized herein that pixels and pixel gates may have varying designs that may affect the relationship between the relative strength of a local potential well and the sign and/or magnitude of an applied voltage, all of which are within the scope of the present disclosure. Accordingly, any examples, figures, or explanations provided herein associated with a particular pixel design are provided merely for illustrative purposes and should not be interpreted as limiting.

Clocking signals provided by the clock generator may provide any distribution of potential wells throughout the pixel array and may further dynamically vary the distribution as a function of time. For example, the clocking signals may provide a 2D array of potential wells suitable for collecting charge associated with incident illumination. For instance, the clocking signals may provide, but are not required to provide, a potential well within each pixel of the pixel array. In this regard, the clocking signals may be characterized as a spatially periodic function along the rows and/or columns of pixels in the pixel array. Further, the clocking signals may be temporally periodic. For example, the clocking signals may periodically vary the voltage of pixel gate. In this regard, the 2D spatial distribution of potential wells may be dynamically modified (e.g., to shift the potential wells along the scan direction with a rate synchronized with the motion of an imaged object).

Clocking signals controlling pixel gate voltages may incorporate any number of clocking schemes to provide charge transfer through a pixel array. For example, clocking signals may be characterized by a number of independent gate drive signals (e.g., phases) required to transfer charge from one unit area to another. In this regard, a N-phase clocking signal includes N independent gate drive signals.

Typical clocking schemes for TDI devices include the same number of phases as gates in a pixel. For example, a typical clocking scheme for an array of three-gate pixels may include three phase signals. Accordingly, a first gate of each pixel may be driven by a first phase signal, a second gate of each pixel may be driven by a second phase signal, and a third gate of each pixel may be driven by a third phase signal. By way of another example, a typical clocking scheme for an array of four-gate pixels may include four phase signals. Accordingly, a first gate of each pixel may be driven by a first phase signal, a second gate of each pixel may be driven by a second phase signal, a third gate of each pixel may be driven by a third phase signal, and a fourth gate of each pixel may be driven by a fourth phase signal. In this regard, a cycle of typical clocking signals includes simultaneously driving each gate of a pixel with a cycle of a corresponding phase signal to transfer charge from each pixel to an adjacent pixel along the scan direction.

Additional embodiments of the present disclosure are directed to clocking schemes utilizing more phases than gates in a pixel. For example, clocking signals may treat two or more adjacent pixels in the scan direction as a single unit (e.g., a clocking group) and provide independent drive signals for each gate in the clocking group. In one instance, a six-phase clocking scheme for an array of three-gate pixels may provide independent drive signal for each gate of adjacent pixel pairs. In another instance, a nine-phase clocking scheme for an array of three-gate pixels may provide independent drive signal for each gate of adjacent pixel triplets. In another instance, an eight-phase clocking scheme for an array of four-gate pixels may provide independent drive signal for each gate of adjacent pixel pairs.

Clocking signals having independent phase signals distributed across multiple adjacent pixels may facilitate power-efficient operation with reduced power consumption and associated heat dissipation than clocking signals having independent phases for gates within a single pixel. For example, phase signals distributed across multiple adjacent pixels may facilitate the generation of a single common potential well for each pixel group that may span across pixel borders. Further, the increased number of gates within a clocking group provides flexibility for the size and strength of the common potential well. For instance, the common potential well may be configured to be larger than the pixel width. In another instance, the common potential well may be configured to be equal to or smaller than the pixel width. In this regard, the amount of power required to generate and maintain the common potential well may be adjustable and may be reduced relative to an amount of power required to generate potential wells for each pixel in the pixel array. Considering the example above, a six-phase clocking scheme for an array of three-gate pixels may provide an approximately 2× reduction in power consumption and associated heat dissipation.

Additional embodiments of the present disclosure are directed to clocking signals designed to provide zero (or substantially zero) net ground return currents for pixel groups associated with the sum of currents from gates within the pixel groups. It is recognized herein that large return currents may negatively impact the speed (e.g., the clocking rate, or the like) and/or the sensitivity of a TDI sensor. Accordingly, clocking signals providing zero net ground return currents for pixel groups may facilitate enhanced clocking performance (e.g., increased sensor speed, decreased power consumption, increased charge storage capacity, or the like) without degrading the sensitivity or device speed.

Further, a common pixel well associated with a pixel group may have greater charge-storage capacity than pixel wells confined to single pixels. For example, clocking signals having independent phase signals distributed across multiple adjacent pixels may facilitate potential wells with finely-tailored sizes as well as energy profiles (e.g., slopes of the energy distribution forming the potential well, or the like) that provide increased charge storage capacity beyond single-pixel wells.

It is recognized herein that adjusting the number of pixels in a clocking group may adjust the imaging resolution along the scan direction accordingly, while maintaining the resolution along the orthogonal direction (e.g., the line imaging direction of a TDI device) as the pixel width. For example, a two-pixel clocking scheme may have half the imaging resolution of a single-pixel clocking scheme, and the like. However, it is further recognized herein that TDI devices are commonly operated in a binning mode to increase signal sensitivity at the expense of image resolution. For example, in a binning mode, charge from two or more pixels in the scanning direction may be integrated at an output stage (e.g., subsequent to charge collection and prior to an output amplification stage) to provide increased signal strength. Accordingly, providing independent phase signals distributed across multiple pixels may provide enhanced power dissipation performance while maintaining the resolution and other performance specifications of binning modes.

FIG. 1A is a conceptual view of a TDI sensor 100, in accordance with one or more embodiments of the present disclosure. In one embodiment, the TDI sensor 100 includes a pixel array 102 for collecting charge in response to incident illumination. The pixel array 102 may contain pixels 104 distributed along a line-imaging direction 106 (e.g., shown as rows in FIG. 1A) as well as a scan direction 108 (e.g., shown as columns in FIG. 1A) configured to generate unbound electric charges (e.g., electrons) in proportion to the intensity of incident illumination. Accordingly, when used in an imaging configuration in which an object is imaged onto the pixel array 102, the pixel array 102 may provide a 2D charge distribution corresponding to the image of the object.

The TDI sensor 100 may additionally include read-out components suitable for transferring collected charge from the pixel array 102 and providing an output signal suitable for generating a digital image corresponding to the charge distribution collected by the pixel array 102. In one embodiment, the TDI sensor 100 includes a clock generator 110 to generate clocking signals to continuously transfer charge along the scan direction 108 (e.g., downward along the columns in FIG. 1A) at a rate synchronized with the motion of imaged objects. In this regard, each row of pixels 104 along the line-imaging direction 106 may continually generate line images and the clocking signals may continuously transfer collected charge from one row to the next along the scan direction 108. Thus, as an image of an object moves across the pixel array 102, charges associated with the image may be continually collected and integrated such that the signal strength at the edge of the pixel array 102 may be proportional to the time required for the image to move across the pixel array 102 (e.g., the integration time is related to the number of rows of pixels 104 along the scan direction 108 and the charge transfer rate along the scan direction 108).

Each pixel 104 of the pixel array 102 may further include multiple gates to facilitate charge collection and transfer along the scan direction 108. Pixel gates may include components (e.g., terminals suitable to receive driving signals, one or more material layers, and the like) suitable for providing a controllable electrical charge storage capacity within the pixel 104. For example, the pixel gates may facilitate the adjustment of electrical properties of surrounding material layers (e.g., through the application of a voltage to a terminal). In this regard, the application of a drive signal (e.g., a voltage drive signal) to the terminal may locally adjust the electrical properties of surrounding material layers such as, but not limited to, the band structure or internal potentials. Further, the drive signals of multiple gates may be dynamically adjusted together to provide a potential well for the storage electrical charge in response to incident illumination.

The pixels 104 may have any design suitable for generating, collecting, and transferring charge in response to incident illumination. For example, the pixel gates may include, but are not required to include, polysilicon gates having electrical properties controllable by a voltage applied to a terminal. Further, the pixels 104 may include any number of gates. For example, the pixels 104 may include, but are not limited to, three gates or four gates per pixel 104.

Figure 1B:
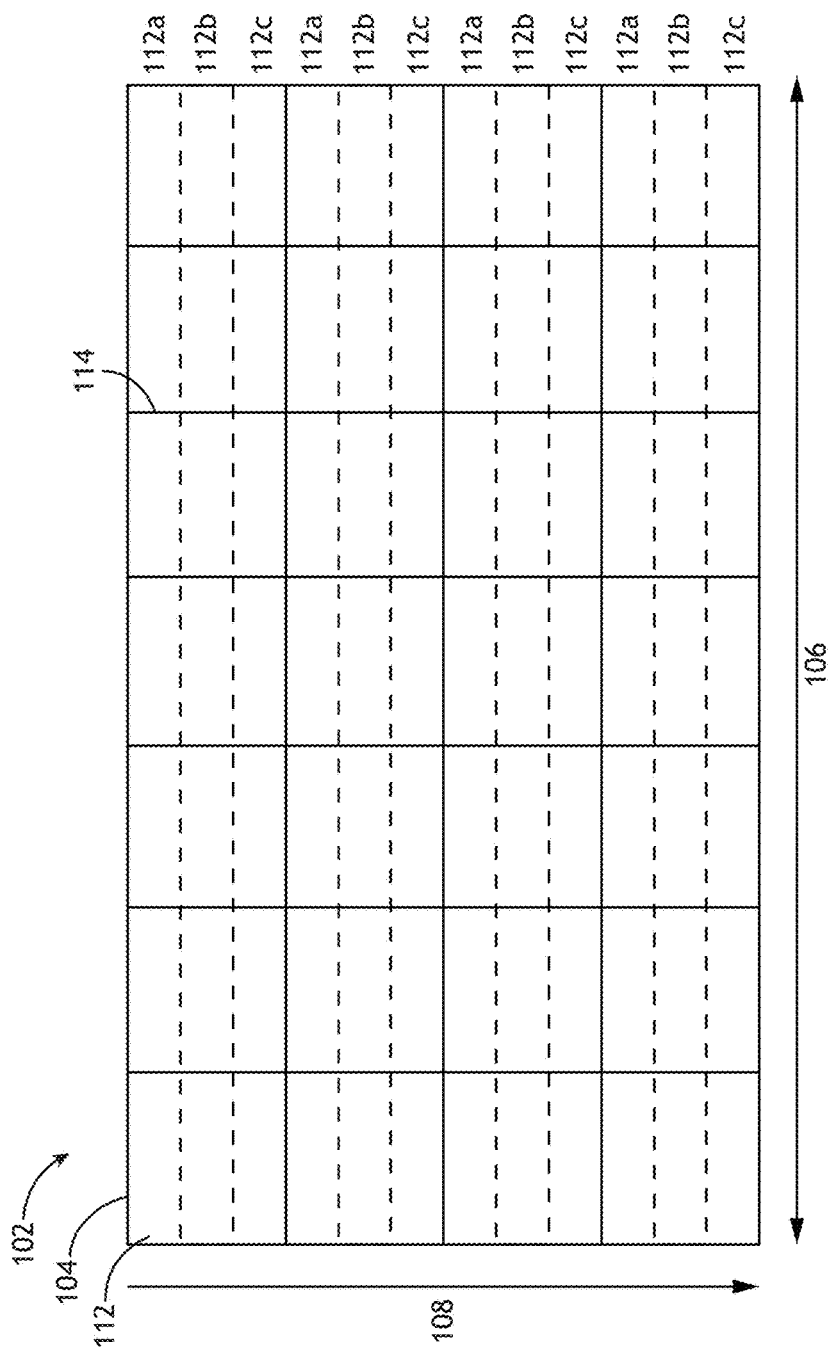
FIG. 1B is a conceptual view of pixels of a pixel array suitable for transferring charge along the scan direction, in accordance with one or more embodiments of the present disclosure.

FIG. 1B is a conceptual view of pixels 104 of a pixel array 102 suitable for transferring charge along the scan direction 108, in accordance with one or more embodiments of the present disclosure. In one embodiment, pixels 104 of the pixel array 102 include three gates 112 distributed along the scan direction 108. For example, each pixel 104 may include a first gate 112a, a second gate 112b, and a third gate 112c. In this regard each gate 112 may include a terminal (not shown) suitable for accepting an independent drive signal (e.g., a phase signal) from the clock generator 110. Further, relative differences in the drive signals between the first gate 112a, the second gate 112b, and the third gate 112c may be adjusted to provide a potential well for the collection of charges and may be further be dynamically adjusted to transfer collected charge along the scan direction 108.

In another embodiment, the TDI sensor 100 includes one or more column blocks 114 for containing charge collected within each column of the pixel array 102. In this regard, charge collected in one column does not spill over to an adjacent column. For example, the column blocks 114 may provide potential barriers that prevent the transfer of electrical charge across the column blocks 114.

In another embodiment, the TDI sensor 100 includes one or more serial registers 116 to collect charges from each column of pixels 104 and transfer the charges (e.g., along charge transfer direction 118) to one or more output amplifiers 120 to provide the output signal. For example, the TDI sensor 100 may include a single output amplifier 120 to read out the charge associated with all columns of the pixel array 102. By way of another example, the TDI sensor 100 may include two or more output amplifiers 120 to read out the charge associated with subsets of the columns of the pixel array 102. In this regard, increasing the number of output amplifiers 120 may facilitate faster read-out speeds.

In another embodiment, though not shown, the TDI sensor 100 includes one or more transfer gates (e.g., buffer gates) to facilitate charge transfer between an imaging portion 122 of the pixel array 102 and the one or more serial registers 116.

Figure 1C:
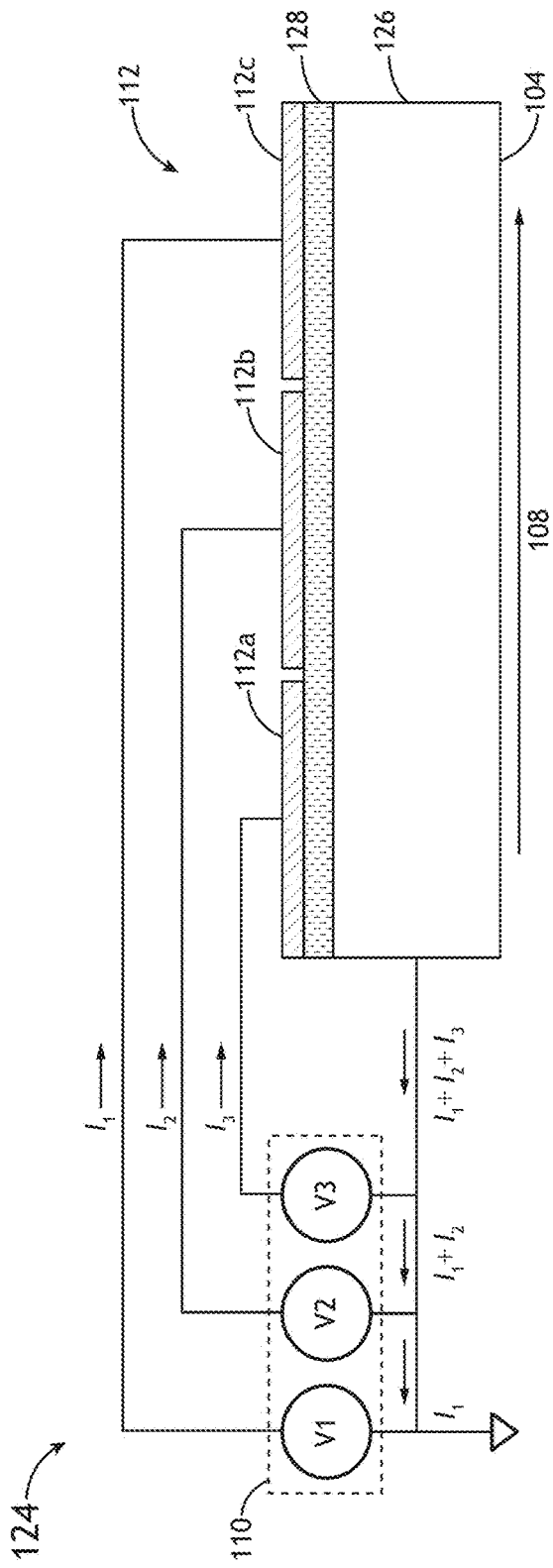
FIG. 1C is a schematic of an electrical circuit for driving a pixel from the pixel array illustrated in FIG. 1B, in accordance with one or more embodiments of the present disclosure.

FIG. 1C is a schematic 124 of an electrical circuit for driving a pixel 104 from the pixel array 102 illustrated in FIG. 1B, in accordance with one or more embodiments of the present disclosure. In FIG. 1C, the pixel 104 is shown conceptually in a cross-section view. In one embodiment, the pixel 104 is a multi-layer structure including at least a semiconductor substrate 126 (e.g., one or more layers of semiconductor materials), an insulating layer 128 (e.g., silicon dioxide, or the like), and gates 112a,b,c distributed along the scan direction 108 for controlling the distribution of charge storage in the pixel 104. The adjacent pixels as well as additional structures of the pixel array 102 incorporating the pixel 104 are not shown in FIG. 1C for clarity. Further, it is recognized herein that a pixel 104 including three gates 112 illustrated in FIG. 1C is provided solely for illustrative purposes and should not be interpreted as limiting. Pixels 104 may include any number of gates 112 suitable for modifying the spatial distribution of charge storage.

In another embodiment, each gate 112 is electrically connected to the clock generator 110, represented in FIG. 1C as voltage sources V1, V2, and V3 for driving the first gate 112a, the second gate 112b, and the third gate 112c, respectively. In this regard, the clock generator 110 may provide independent drive signals (e.g., voltage signals) to the gates 112.

As described previously herein, applying a voltage to a gate 112 (e.g., the first gate 112a, the second gate 112b, or the third gate 112c) may generate a potential well suitable for the storage of electric charge (e.g., electrons generated in response to incident illumination, charge transferred from adjacent pixels 104, or the like). For example, applying a positive voltage to a gate 112 may locally modify the potential of a region in one or more layers of the semiconductor substrate 126 below the insulating layer 128 to attract photo-generated) electrons. Accordingly, the electric charge may be contained within a potential well defined along the scan direction 108 by the distribution of voltages applied to the gates 112 and by the insulating column blocks 114 separating pixels 104 along the line-imaging direction 106. Further, collected charge may be transferred along the scan direction 108 by dynamically modifying the drive signals of the gates 112 as previously described herein.

The application of a voltage to one or more gates 112 of a pixel 104 may further induce return currents as illustrated in FIG. 1C governed by the physical and electrical properties of the pixel 104. For example, the return current, I, introduced by application of a voltage, V, associated with a drive signal to a gate 112 may be modeled based on the capacitance, C, formed by the gate 112 in combination with the insulating layer 128 and the semiconductor substrate 126:

$$I = C\frac{dV}{dt}. \quad (1)$$

Further, the net return current, $I_{net}$ of a pixel 104 (e.g., including current $I_1$, current $I_2$ and current $I_3$ as illustrated in FIG. 1C) may be represented as the sum of the return currents associated with all gates 112 within the pixel. Accordingly, the net return current for a pixel 104 having n gates may be characterized as:

$$I_{net} = \sum_{k=1}^{n} C_k \frac{dV_k}{dt}, \quad (2)$$

where k=0, 1, . . . , n−1.

These return currents may impact the performance of the TDI sensor 100. For example, return currents may induce voltage fluctuations in the ground circuitry of the TDI sensor 100 based on the resistance of the substrate 126, which may introduce noise measurement errors, or the like. Further, the speed and/or sensitivity of the TDI sensor 100 may be determined at least in part by return currents. Accordingly, it may be desirable to minimize the net return current within selected specifications to achieve a desired level of performance.

Figure 2:
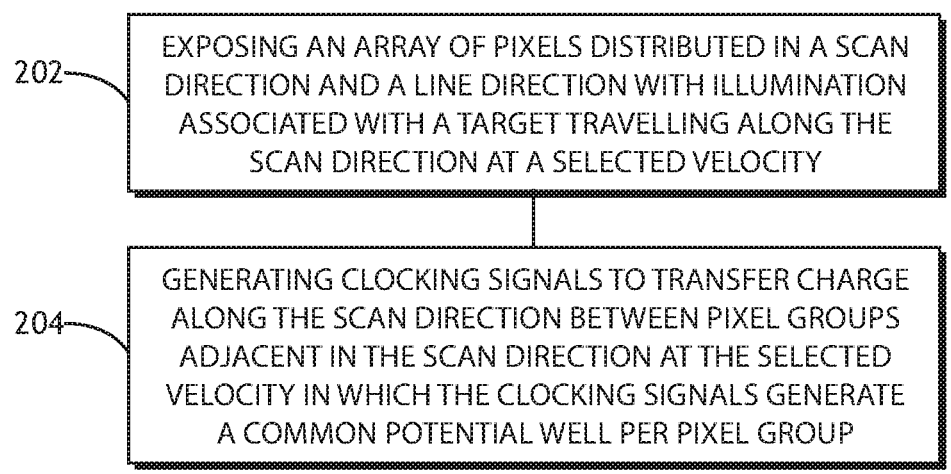
FIG. 2 is a flow diagram illustrating steps performed in a method for clocking a TDI device, in accordance with one or more embodiments of the present disclosure.

FIG. 2 is a flow diagram illustrating steps performed in a method 200 for clocking a TDI device (e.g., TDI sensor 100), in accordance with one or more embodiments of the present disclosure. Applicant notes that the embodiments and enabling technologies described previously herein in the context of the TDI sensor 100 should be interpreted to extend to method 200. It is further noted, however, that the method 200 is not limited to the architecture of TDI sensor 100.

In one embodiment, the method 200 includes a step 202 of exposing an array of pixels distributed in a scan direction and a line direction perpendicular to the scan direction with illumination associated with a target travelling along the scan direction at a selected velocity. For example, an array of pixels (e.g., a pixel array 102) may include pixels suitable for generating and collecting electrical charge (e.g., electrons) in response to an image of the target such that the collected 2D distribution of charges corresponds to the intensity of an image of the moving target. Further, the pixels may include gates distributed in the scanning direction suitable for generating a potential well for charge collection and charge transfer. The pixels may include any number of gates suitable for controlling charge collection and transfer. For example, pixels may include, but are not limited to, three gates or four gates.

In another embodiment, the method 200 includes a step 204 of generating clocking signals to transfer charge along the scan direction between pixel groups adjacent in the scan direction at a rate corresponding to the selected velocity of the target in which the pixel groups include two or more pixels adjacent in the scan direction and the clocking signals generate a common potential well per pixel group for containing charge generated in response to the illumination and further transfer the charge to an adjacent pixel group along the scan direction.

For example, pixels of the pixel array may be divided into pixel groups including two or more pixels adjacent along the scan direction for the purposes of clocking. In this regard, the clocking signals (e.g., provided by a clock generator 110) may include a set of independent phase signals suitable for driving the gates of each pixel within a pixel group. Accordingly, each pixel gate within a pixel group may be independently controlled for the generation of a potential well for charge storage and for the transfer of stored charge to an adjacent pixel group. Further, pixel groups may include any number of adjacent pixels along the scan direction 108 such as, but not limited to, two, three, or four pixels.

Figure 3:
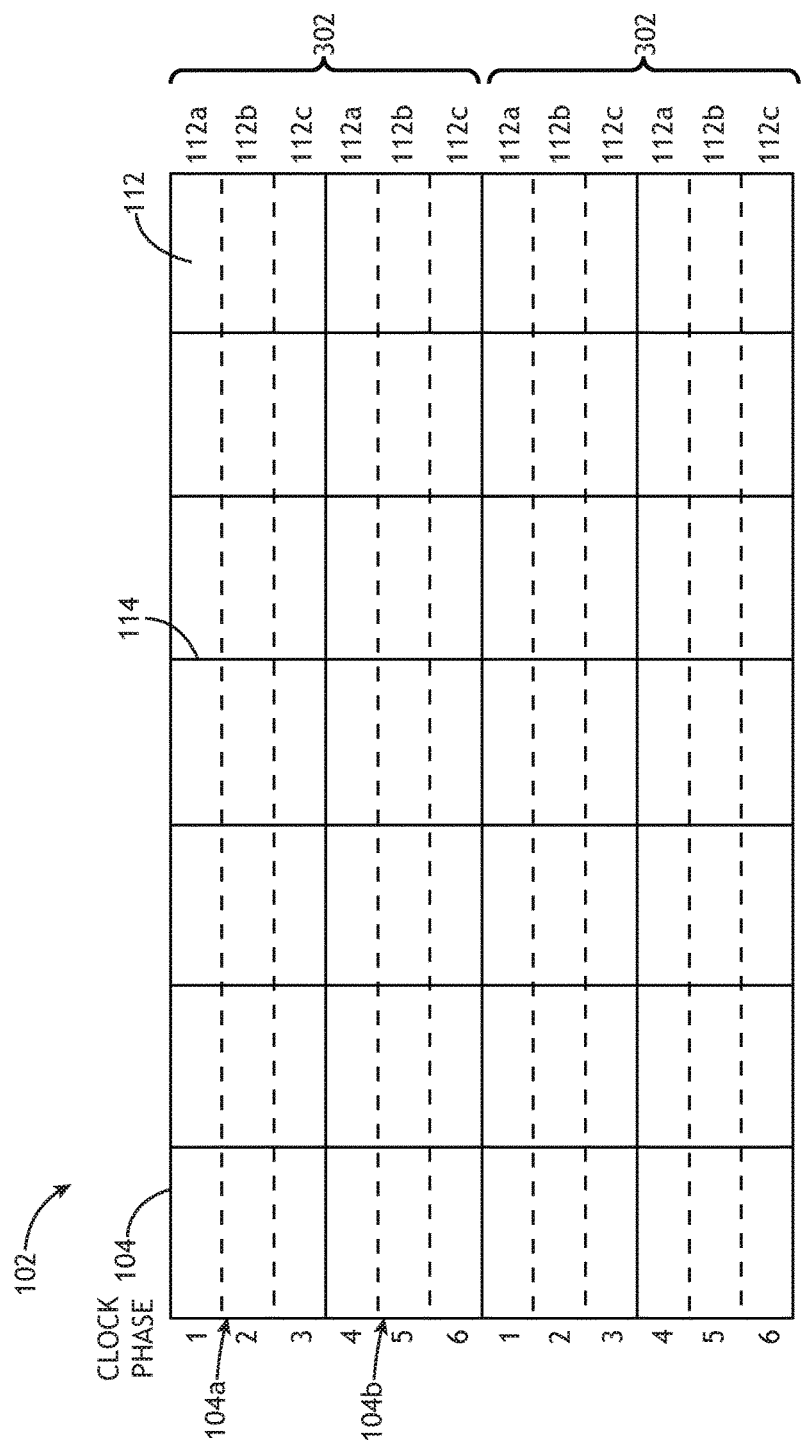
FIG. 3 is a conceptual view of the distribution of phase signals to gates of pixels of the pixel array of FIG. 1B, in accordance with one or more embodiments of the present disclosure.

FIG. 3 is a conceptual view of the pixel array 102 of FIG. 1B illustrating a distribution of phase signals to pixel groups, in accordance with one or more embodiments of the present disclosure. For example, the pixels 104 may each include three gates 112 and may be divided in to pixel groups including two adjacent pixels. Accordingly, clocking signals may include a set of six phase signals to drive the six gates of each pixel group.

In one embodiment, each pixel group 302 may include a first pixel 104*a* and a second pixel 104*b*. Accordingly, as illustrated in FIG. 3, a first phase signal may drive the first gate 112*a* of the first pixel 104*a*, a second phase signal may drive the second gate 112*b* of the first pixel 104*a*, a third phase signal may drive the third gate 112*c* of the first pixel 104*a*, a fourth phase signal may drive the first gate 112*a* of the second pixel 104*b*, a fifth phase signal may drive the second gate 112*b* of the second pixel 104*b*, and a sixth phase signal may drive the third gate 112*c* of the second pixel 104*b*. This pattern may be repeated for each pixel group 302 of the pixel array 102. In this regard, the clocking signals provided by the clock generator 110 may include sets of the 6-phase phase signals for each pixel group 302.

It is to be understood that the illustration of a particular pixel design (e.g., a number of gates, or the like) and a particular number of grouped pixels for clocking purposes illustrated in FIG. 3 is provided solely for illustrative purposes and should not be interpreted as limiting. In a general sense, a pixel group 302 may include any number of pixels 104 having any number of pixel gates 112. For example, a pixel group 302 including three pixels 104 having three gates 112 each may be clocked using nine independent phase signals. By way of another example, a pixel group 302 including two pixels 104 having four gates 112 each may be clocked by eight independent phase signals.

Further, the division of pixels 104 into pixel groups 302 along the scan direction 108 may be implemented in a variety of ways without departing from the spirit and scope of the present disclosure. In one embodiment, the pixel groups (e.g., pixel group 302) are provided by physically wiring gates from each pixel group together. For example, considering the example provided in FIG. 3, the first gate 112*a* of the first pixel 104*a* of each pixel group 302 may be physically wired together to receive the first phase signal, second gate 112*a* of the first pixel 104*a* of each pixel group 302 may be physically wired together to receive the second phase signal, and so on. In another embodiment, each pixel 104 may be independently wired to the clock generator 110. The clock generator 110 may then selectively provide the first phase signal to the first gate 112*a* of the first pixel 104*a* of each pixel group 302, the second phase signal to the second gate 112*a* of the first pixel 104*a* of each pixel group 302, and so on. Selectively providing phase signals to independently-wired pixels 104 may provide clocking flexibility. For example, the number of pixels in a pixel group 302 may be dynamically configured either as an initialization parameter or on the fly for dynamic clocking adjustments (e.g., to respond to specific performance and/or power consumption requirements).

Referring generally to FIGS. 4 through 9, TDI clocking schemes for single pixels and pixel groups are described. In the associated embodiments, clocking signals (and the associated phase signals) include time-varying voltage signals. However, in additional embodiments, clocking signals may include time-varying current signals.

Figure 4:
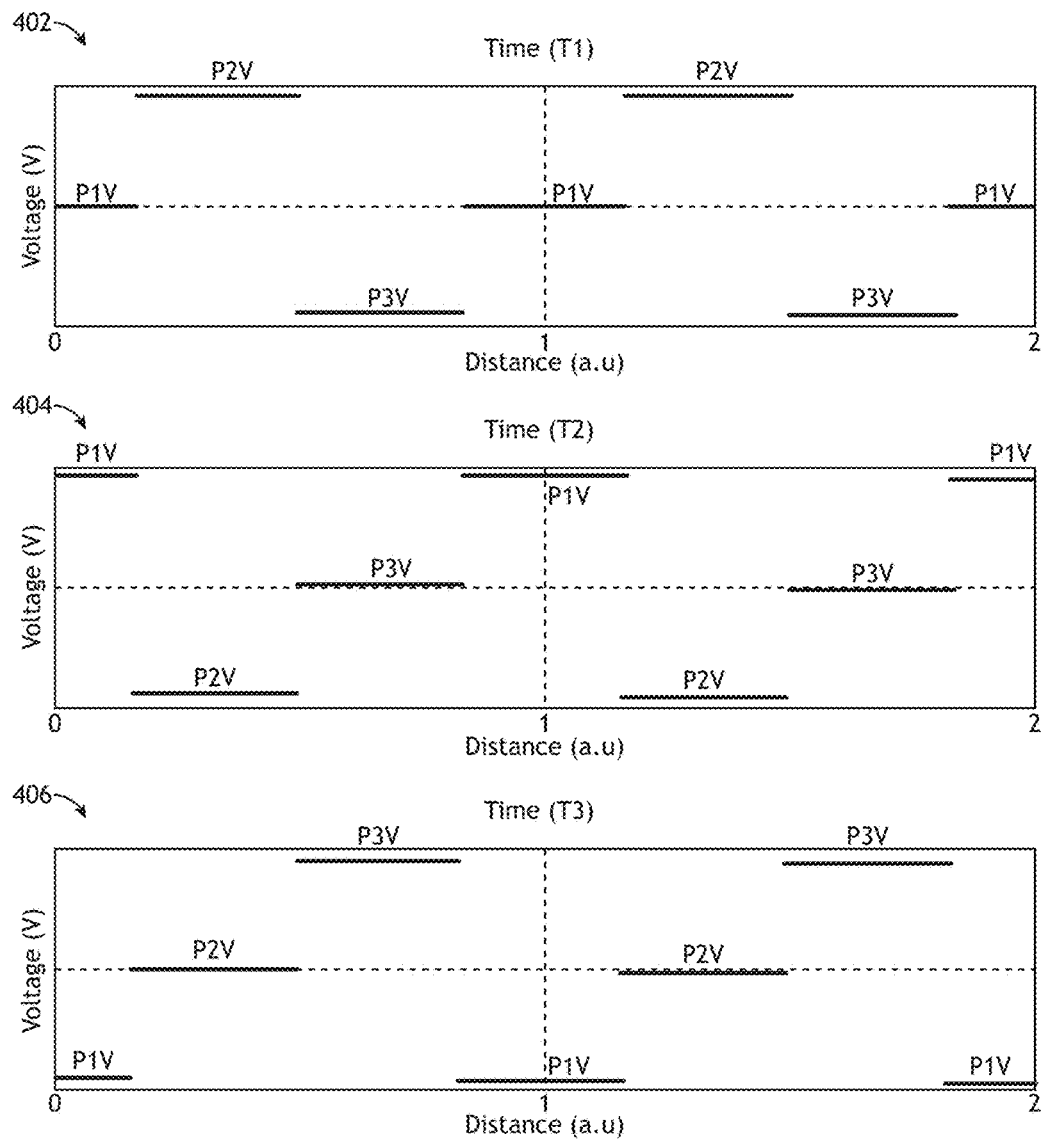
FIG. 4 includes plots of a distribution of gate voltages along a scanning direction at three time snapshots associated with a three-phase clocking signal for driving three-gate pixels with clocking pixel groups including a single pixel, in accordance with one or more embodiments of the present disclosure.

FIG. 4 includes plots 402-406 of a distribution of gate voltages along a scanning direction at three time snapshots associated with a three-phase clocking signal for driving 3-gate pixels with clocking pixel groups including a single pixel, in accordance with one or more embodiments of the present disclosure. For example, plots 402-406 may describe, but are not required to describe, a clocking scheme for the pixel array 102 illustrated in FIG. 1B in which an independent set of three phase signals is provided by the clock generator 110 to drive the three gates 112 of each pixel 104. Accordingly, a first phase signal (P1V) may drive a first gate 112a of each pixel 104, a second phase signal (P2V) may drive a second gate 112b of each pixel 104, and a third phase signal (P3V) may drive a third gate 112c of each pixel 104. In one embodiment, the application of a positive voltage may generate a local potential well. In this regard, potential wells suitable for storing charge (e.g., electrons) generated in response to incident illumination may be, but are not required to be, formed by application of a positive voltage on one or more gates, surrounded by one or more gates having reduced (or zero) applied voltage.

Figure 5:
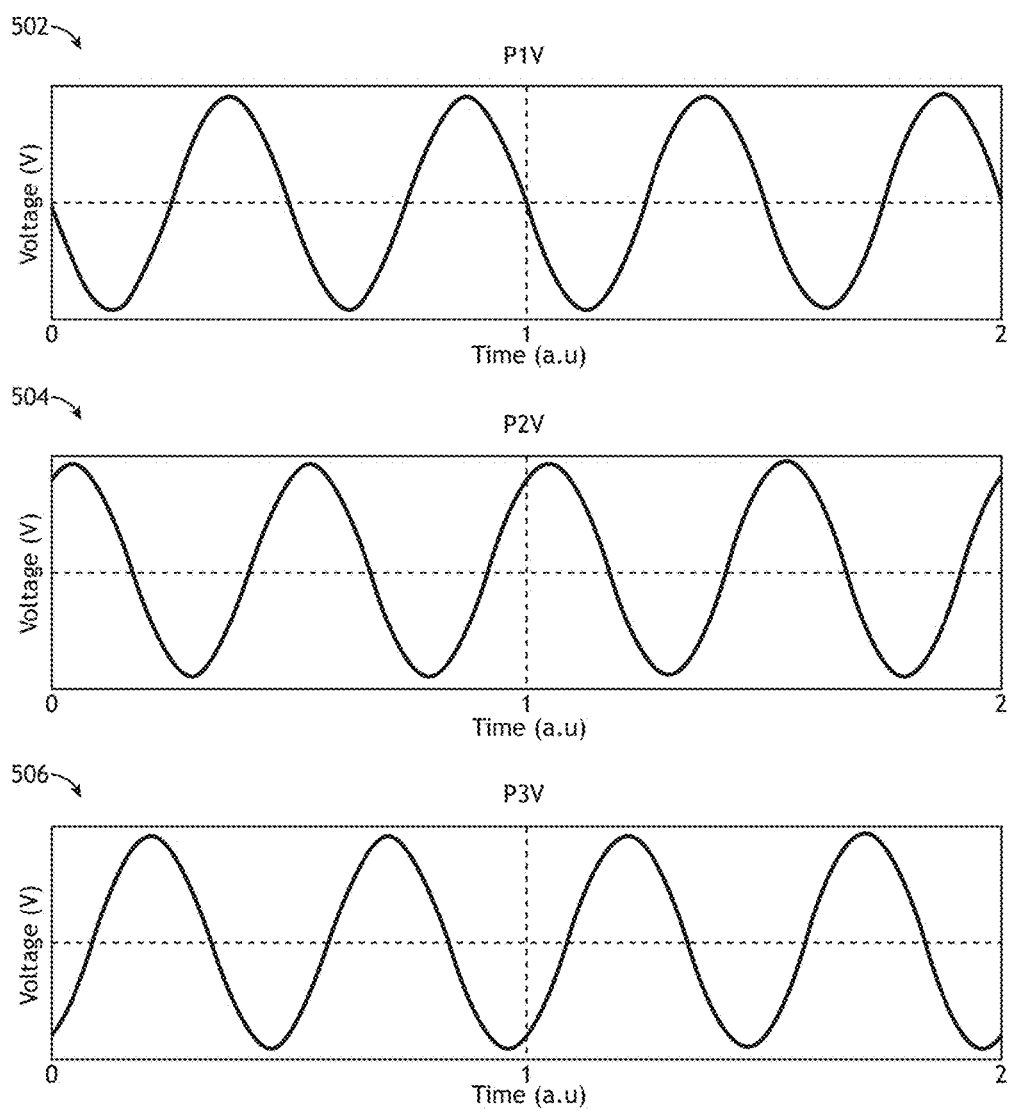
FIG. 5 includes plots of phase signals of the three-phase clocking signal illustrated in FIG. 4 as a function of time, in accordance with one or more embodiments of the present disclosure.

FIG. 5 includes plots 502-506 of phase signals of the 3-phase clocking signal illustrated in FIG. 4 as a function of time, in accordance with one or more embodiments of the present disclosure. Plot 502 is a plot of the first phase signal (P1V), plot 504 is a plot of the second phase signal (P2V), and plot 506 is a plot of the third phase signal (P3V). Accordingly, FIGS. 4 and 5 in combination may describe the time-varying clocking signals as a function of location along a column of a pixel array 102 along the scan direction 108. In one embodiment, each phase signal is a periodic voltage signal that periodically varies the electrical properties of a portion of the pixel 104. Further, the three phase signals are phase-shifted versions of a common periodic signal. In this regard, simultaneously applying the three phase signals to the gates of each pixel will result in a translation of the associated potential wells along the scan direction 108. Further, the frequencies of the phase signals (e.g., P1V, P2V, and P3V) may be adjusted to synchronize the charge transfer rate with the velocity of a target object.

As illustrated in FIGS. 4 and 5, the clocking signals may provide a potential well for each pixel suitable for storing charge generated in response to incident illumination (e.g., associated with a target object moving along the scan direction 108). For example, a distance between potential wells corresponds to approximately three gates 112, which in turn corresponds to the width of a pixel 104. Further, as the clocking signals are cycled in time (e.g., through times T1, T2, and T3), the stored charge may be transferred from one pixel 104 to an adjacent pixel 104 along the scan direction 108.

FIGS. 6-9 illustrate clocking schemes for providing independent clocking signals for gates 112 of pixel groups including more than one pixel (e.g., pixel group 302, or the like) for transferring charge between adjacent pixel groups.

Figure 6:
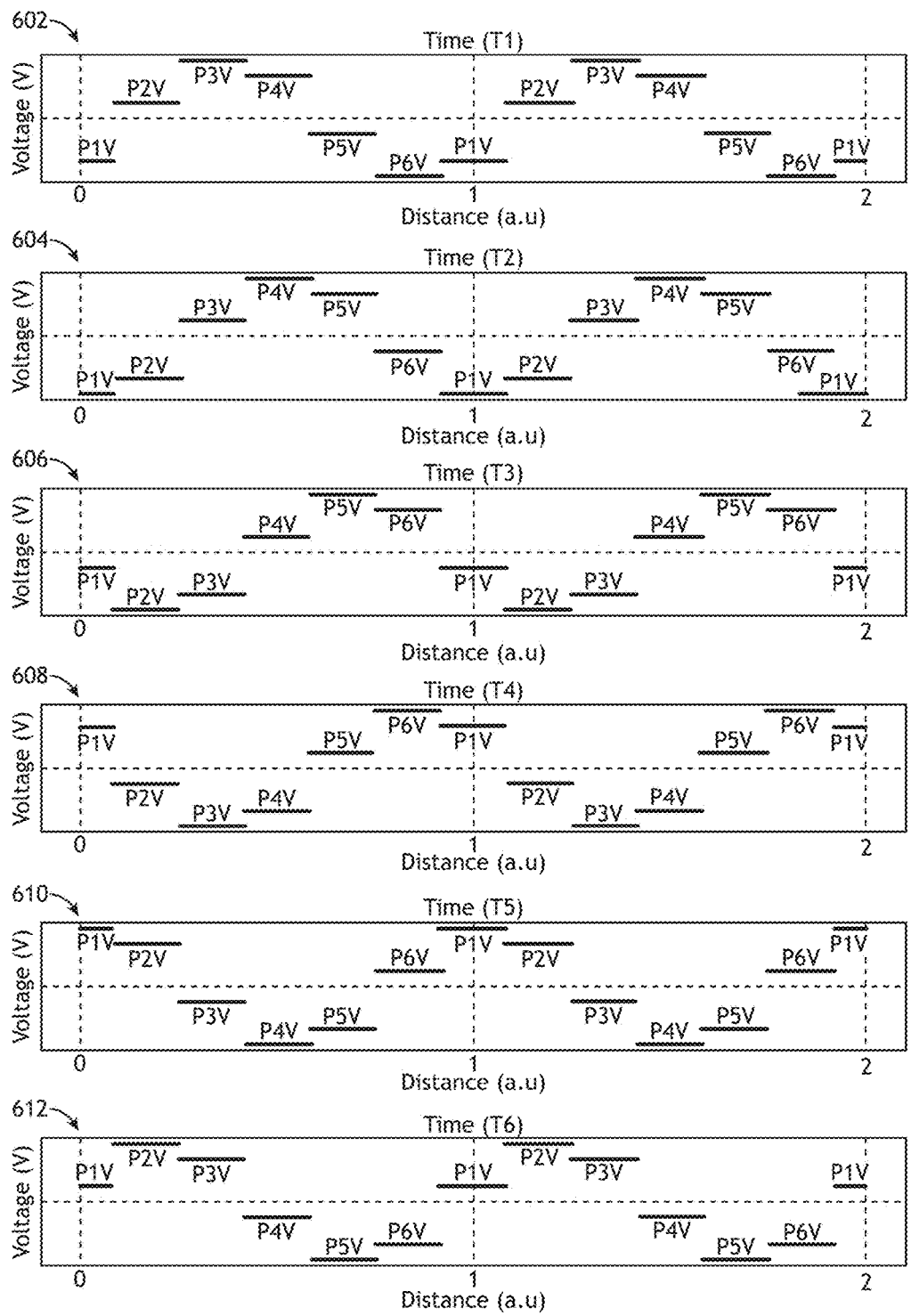
FIG. 6 includes plots of a distribution of sinusoidal gate voltages along a scanning direction at six time snapshots associated with a six-phase clocking signal for driving three-gate pixels with clocking pixel groups including two pixels, in accordance with one or more embodiments of the present disclosure.

FIG. 6 includes plots 602-612 of a distribution of sinusoidal gate voltages along a scanning direction at six time snapshots associated with a six-phase clocking signal for driving 3-gate pixels with clocking pixel groups including two pixels, in accordance with one or more embodiments of the present disclosure. For example, FIG. 6 may describe, but is not required to describe, a clocking scheme for the pixel array 102 illustrated in FIG. 3 in which an independent set of six phase signals is provided by the clock generator 110 to drive the six gates 112 of pixel group 302. Accordingly, a first phase signal (P1V) may drive a first gate 112a of a first pixel 104a of pixel group 302, a second phase signal (P2V) may drive a second gate 112b of a first pixel 104a of pixel group 302, a third phase signal (P3V) may drive a third gate 112c of a first pixel 104a of pixel group 302, a fourth phase signal (P4V) may drive a first gate 112a of a second pixel 104b of pixel group 302, a fifth phase signal (P5V) may drive a second gate 112b of a second pixel 104b of pixel group 302, and a sixth phase signal (P6V) may drive a third gate 112c of a second pixel 104b of pixel group 302. In one embodiment, the application of a positive voltage may generate a local potential well. In this regard, potential wells suitable for storing charge (e.g., electrons) generated in response to incident illumination may be, but are not required to be, formed by application of a positive voltage on one or more gates, surrounded by one or more gates having reduced (or zero) applied voltage.

Figure 7:
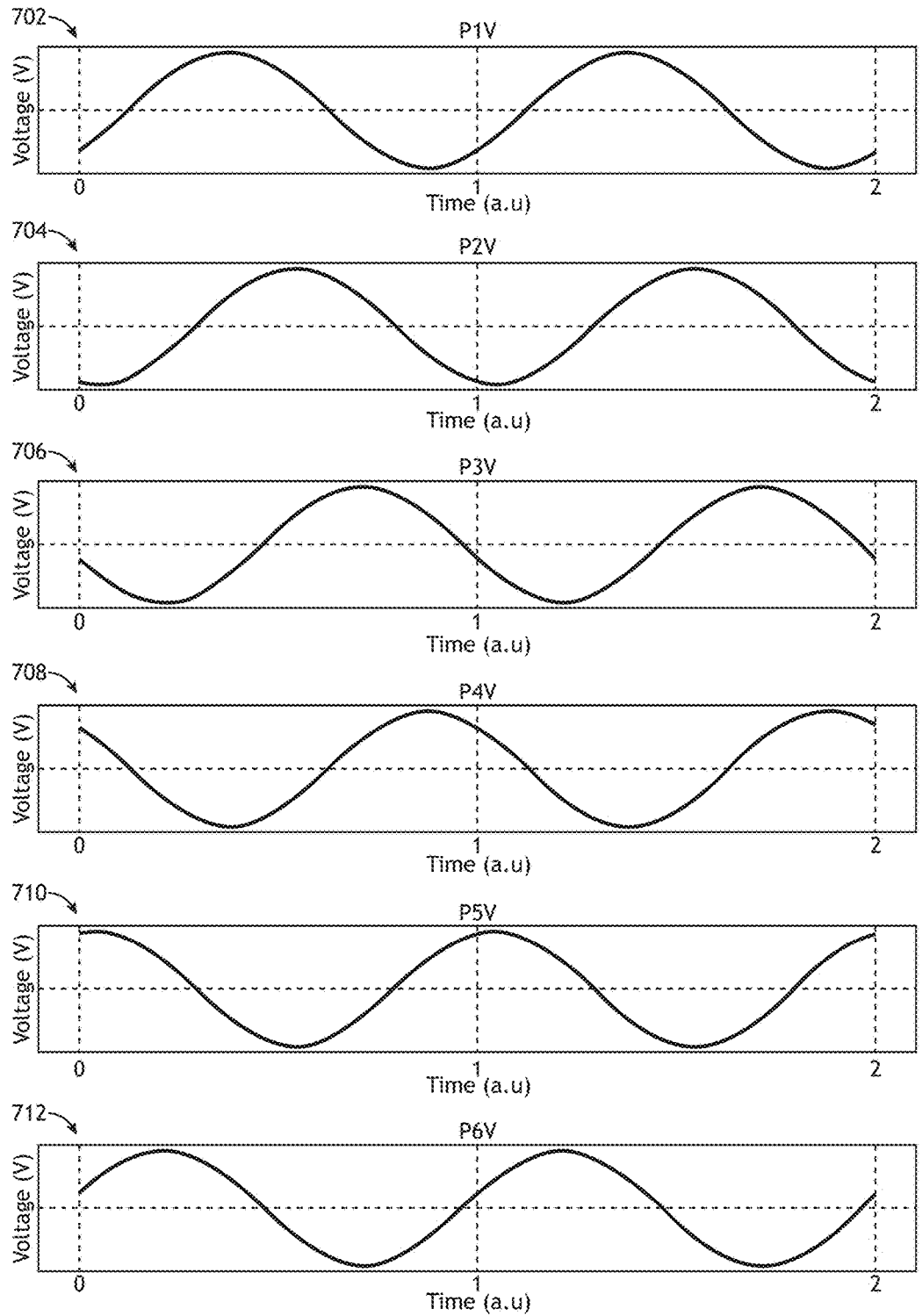
FIG. 7 includes plots of sinusoidal phase signals of the six-phase clocking signal illustrated in FIG. 6 as a function of time, in accordance with one or more embodiments of the present disclosure.

FIG. 7 includes plots 702-712 of sinusoidal phase signals of the 6-phase clocking signal illustrated in FIG. 6 as a function of time, in accordance with one or more embodiments of the present disclosure. Plot 702 is a plot of the first phase signal (P1V), plot 704 is a plot of the second phase signal (P2V), plot 706 is a plot of the third phase signal (P3V), plot 708 is a plot of the fourth phase signal (P4V), plot 710 is a plot of the fifth phase signal (P5V), and plot 712 is a plot of the sixth phase signal (P6V). Accordingly, FIGS. 6 and 7 in combination may describe the time-varying clocking signals as a function of location along a column of a pixel array 102 along the scan direction 108.

As illustrated in FIGS. 6 and 7, the clocking signals may provide a potential well for each pixel group 302 suitable for storing charge generated in response to incident illumination (e.g., associated with a target object moving along the scan direction 108). For example, a common potential well is provided for every two pixels 104, which corresponds to the width of the pixel group 302. Further, as the clocking signals are cycled in time (e.g., through times T1, T2, and T3), the stored charge may be transferred from one pixel group 302 to an adjacent pixel group 302 along the scan direction 108.

In one embodiment, each phase signal is a periodic voltage signal that periodically varies the electrical properties of a portion of the pixel 104. For example, as illustrated in FIG. 7, each phase signal may be a periodic pulse signal. Further, the phase signals are phase-shifted versions of a common periodic signal. In this regard, simultaneously applying the three phase signals to the gates 112 of each pixel 104 will result in a translation of the associated potential wells along the scan direction 108 from one pixel group 302 to another. Further, the frequencies of the phase signals may be adjusted to synchronize the charge transfer rate with the velocity of a target object.

However, it is recognized herein that providing clocking signals for pixel groups of two or more pixels (e.g., independent drive signals for gates of two or more adjacent pixels) may provide a number of advantages over providing clocking signals for single pixels. For example, as illustrated in FIGS. 6 and 7, providing clocking signals for pixel groups of two or more pixels may reduce the number and/or the frequency of voltage oscillations at each gate 112 required to provide charge transfer through the pixel array 102 at a selected rate (e.g., synchronized with a velocity of a target object), which may substantially reduce the power consumption of the pixel array 102. For example, power consumption associated with the clocking signals illustrated in FIGS. 6 and 7 based on clocking pixel groups of two may be approximately a factor of two lower than the clocking signals illustrated in FIGS. 4 and 5 based on single-pixel clocking.

It is further recognized herein that reducing the power required to provide charge transfer at a selected rate may provide increased flexibility in the design of TDI sensors. For example, reducing power consumption through clocking of pixel groups greater than two may facilitate TDI sensors having increased imaging speeds reduced design complexity, reduced cooling requirements, or the like.

In another embodiment, clocking signals for each gate of a pixel group (e.g., pixel group 302, or the like) are designed to minimize, within a selected tolerance, the net return current associated with the pixel group. In this regard, the net return current for a given gate or pixel may not be minimized within the selected tolerance, but the net return current associated with all pixels 104 within a pixel group may be minimized within the selected tolerance.

For example, referring to equation (2), the net return current, $I_{net,group}$, associated with a pixel group including m pixels having n gates each may be characterized as:

$$I_{net,group} = \sum_{k=1}^{m \times n} C_k \frac{dV_k}{dt}, \quad (3)$$

where k=0, 1, . . . , (m×n)−1. In one embodiment, the drive signals $V_k$ may include solutions to $$I_{net,group} = \sum_{k=1}^{m \times n} C_k \frac{dV_k}{dt} \approx 0 \quad (4)$$

where k=0, 1, . . . , (m×n)−1. It is recognized herein that equations (2)-(3) characterize the return current associated with a capacitance between gates 112 and a substrate 126 with non-zero resistance (e.g., a substrate current). Accordingly, equation (4) provides solutions for drive signals providing net return currents with minimal substrate currents, which may facilitate a stable substrate potential during operation of the TDI sensor 100. In additional embodiments, drive signals may be generated to minimize return currents associated with additional sources of capacitance within a pixel 104 such as, but not limited to, capacitance between gates 112.

Further, it may be the case, but is not required to be the case, that the capacitances $C_k$ of the gates in the pixel group are equal. This condition may be true when the pixels have a common structure and are fabricated using a common fabrication process. In this case, the drive signals $V_k$ may include solutions to $$I_{net,group} = \sum_{k=1}^{m \times n} \frac{dV_k}{dt} \approx 0 \quad (5)$$

where k=0, 1, . . . , (m×n)−1.

In this case, the drive equations may have, but are not required to have, the form of sinusoidal waves:

$$V_k = \sin\left(\omega t + \frac{2\pi k}{m \cdot n}\right), \quad (6)$$

where k=0, 1, . . . , (m×n)−1.

For example, the clocking signals illustrated in FIGS. 6 and 7 may be generated in accordance with equations (3)-(6) to provide a minimized net return current for each pixel group 302 that is approximately zero within a selected tolerance.

It is recognized herein that solutions for drive equations based on pure sinusoidal signals may provide low signal bandwidth and low-noise operation. However, it is further recognized that non-equal capacitance values (e.g., nonequal values of $C_k$) for gates within a pixel group may result in a non-zero return current and/or additional harmonics. In such a case, the drive signals $V_k$ may be individually adjusted accordingly to compensate. Further, non-sinusoidal drive equations may provide minimized net return currents.

Figure 8:
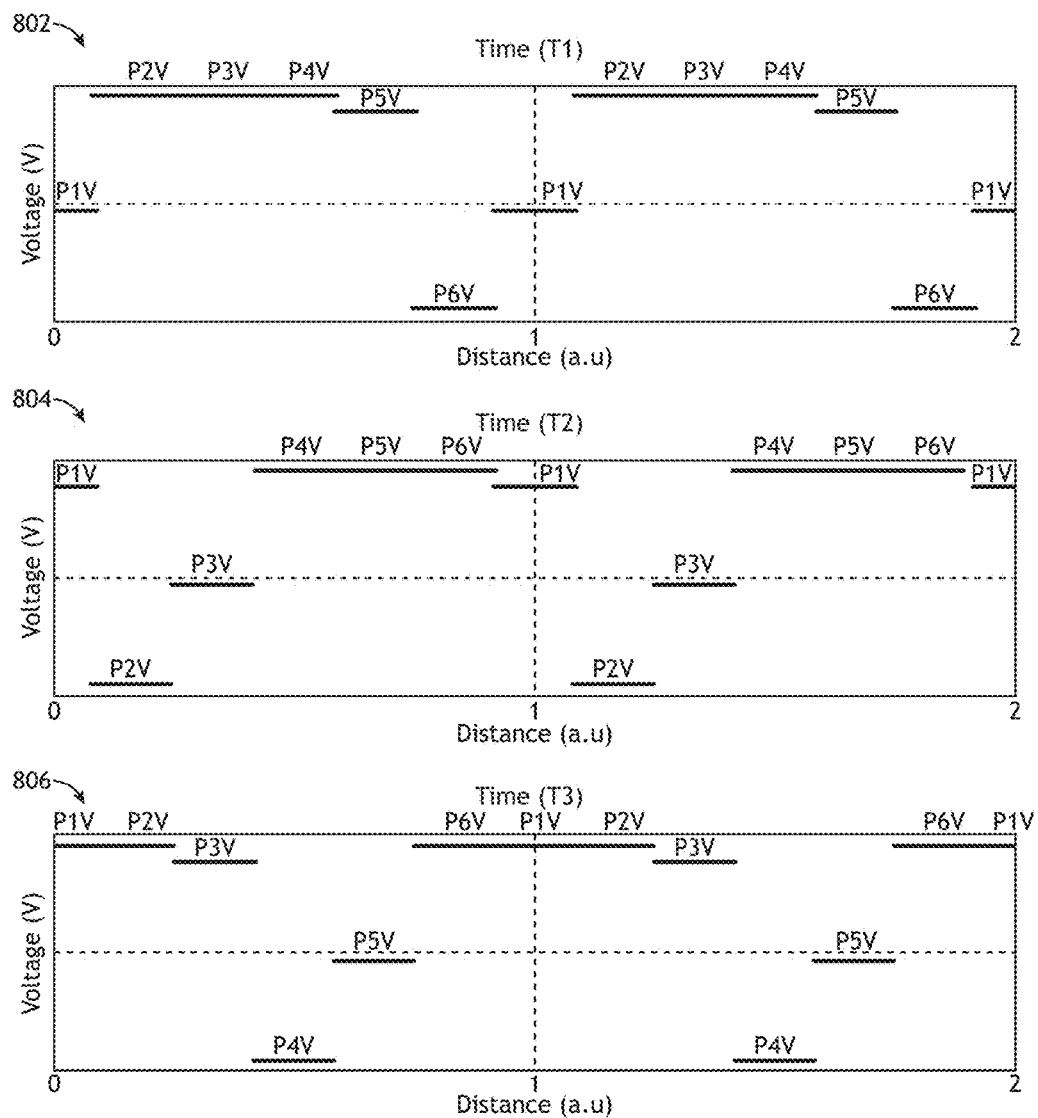
FIG. 8 includes plots of a distribution of non-sinusoidal gate voltages along a scanning direction at three time snapshots associated with a six-phase clocking signal for driving three-gate pixels with clocking pixel groups including two pixels, in accordance with one or more embodiments of the present disclosure.
Figure 9:
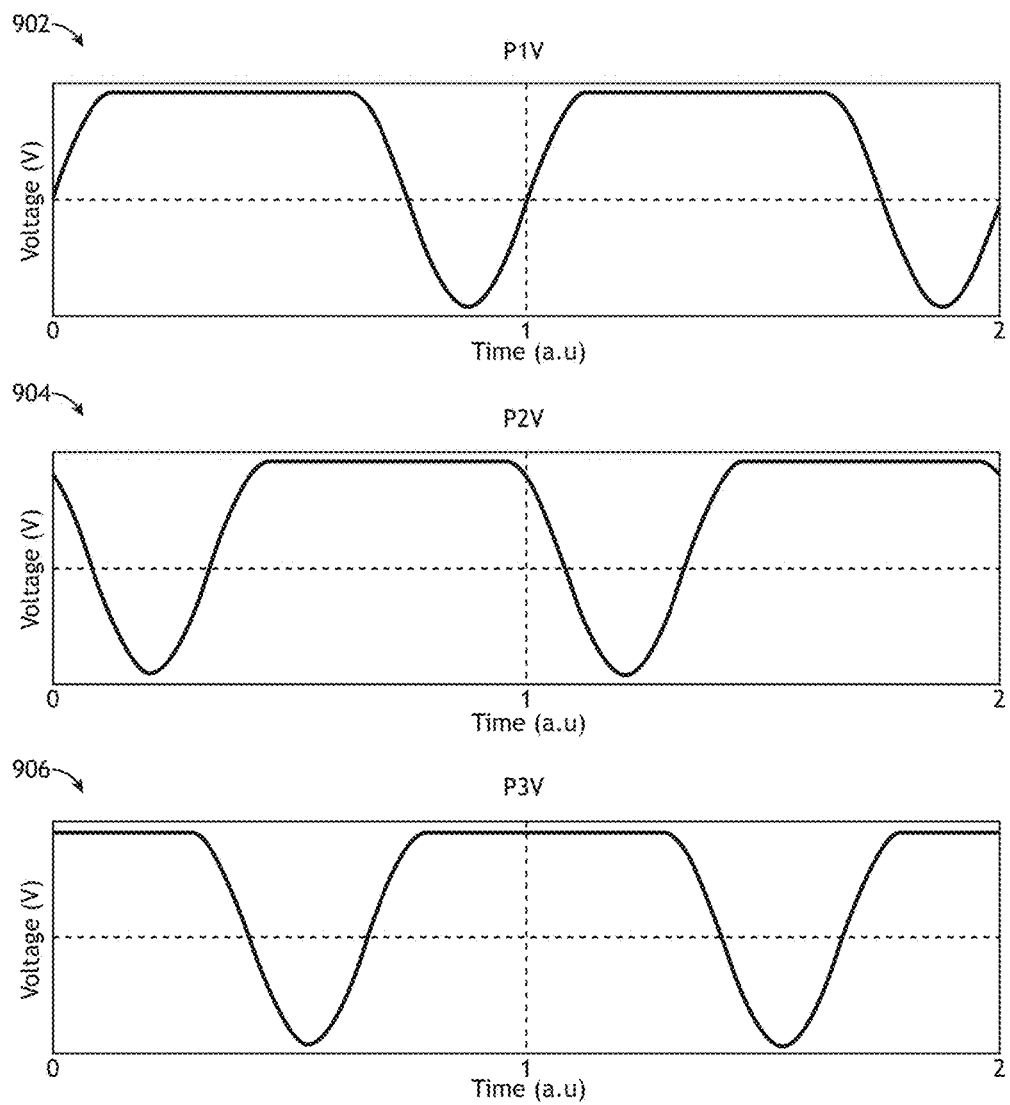
FIG. 9 includes plots of non-sinusoidal phase signals of three of the six clocking signal phases illustrated in FIG. 8 as a function of time, in accordance with one or more embodiments of the present disclosure.

FIGS. 8 and 9 illustrate non-sinusoidal clocking schemes for gates 112 of pixel groups including more than one pixel (e.g., pixel group 302, or the like) for transferring charge between adjacent pixel groups.

FIG. 8 includes plots 802-806 of a distribution of non-sinusoidal gate voltages along a scanning direction at three time snapshots associated with a six-phase clocking signal for driving 3-gate pixels with clocking pixel groups including two pixels, in accordance with one or more embodiments of the present disclosure. For example, FIG. 8 may describe, but is not required to describe, a clocking scheme for the pixel array 102 illustrated in FIG. 3 in which an independent set of six phase signals is provided by the clock generator 110 to drive the six gates 112 of pixel group 302. Accordingly, a first phase signal (P1V) may drive a first gate 112*a* of a first pixel 104*a* of pixel group 302, a second phase signal (P2V) may drive a second gate 112*b* of a first pixel 104*a* of pixel group 302, a third phase signal (P3V) may drive a third gate 112*c* of a first pixel 104*a* of pixel group 302, a fourth phase signal (P4V) may drive a first gate 112*a* of a second pixel 104*b* of pixel group 302, a fifth phase signal (P5V) may drive a second gate 112*b* of a second pixel 104*b* of pixel group 302, and a sixth phase signal (P6V) may drive a third gate 112*c* of a second pixel 104*b* of pixel group 302.

FIG. 9 includes plots 902-906 of non-sinusoidal phase signals showing three of the six clocking signal phases illustrated in FIG. 8 as a function of time, in accordance with one or more embodiments of the present disclosure. Plot 902 is a plot of the first phase signal (P1V), plot 904 is a plot of the second phase signal (P2V), and plot 906 is a plot of the third phase signal (P3V). Accordingly, FIGS. 8 and 9 in combination may describe the time-varying clocking signals as a function of location along a column of a pixel array 102 along the scan direction 108. Further, the clocking signals illustrated in FIGS. 8 and 9 illustrate non-sinusoidal waveforms for providing a minimized net return current for pixel groups 302.

As illustrated in FIGS. 8 and 9, the clocking signals may provide a non-sinusoidal potential well for each pixel group 302 suitable for storing charge generated in response to incident illumination (e.g., associated with a target object moving along the scan direction 108). For example, a common potential well having a selectable width may be provided for every pixel group 302 (e.g., two pixels 104). Further, as the clocking signals are cycled in time (e.g., through times T1, T2, and T3), the stored charge may be transferred from one pixel group 302 to an adjacent pixel group 302 along the scan direction 108.

Referring generally to FIGS. 6-9, it is further recognized herein that providing clocking signals for pixel groups of two or more pixels may provide increased charge storage capacity per potential well relative to clocking of single pixels. The charge storage capacity of a potential well may be dependent on a number of factors including, but not limited to, a width of the potential well and a depth of the potential well (e.g., a difference in energy levels defining the potential well). In one embodiment, the width of a common potential well of a pixel group 302 (e.g., defined by the application of a positive voltage on one or more gates surrounded by gates with less applied voltage) may be adjustable based on the number of independent phase signals associated with the clocking signal (e.g. six in the examples illustrated in FIGS. 6 and 7). In one instance, as illustrated in FIG. 6, the width of a potential well may be equal to or greater than the width of a constituent pixel. Accordingly, the charge capacity of a pixel array 102 may be improved by providing clocking signals for pixel groups of two or more pixels rather than for single pixels.

It is to be understood that the illustration of a particular pixel design (e.g., a number of gates, or the like) and a particular number of grouped pixels for clocking purposes illustrated in FIGS. 6 and 7 is provided solely for illustrative purposes and should not be interpreted as limiting. As described previously herein, a pixel group may include any number of pixels having any number of pixel gates. For example, a pixel group including three pixels having three gates each may be clocked using nine independent phase signals. By way of another example, a pixel group including two pixels having four gates each may be clocked by eight independent phase signals.

Figure 10:
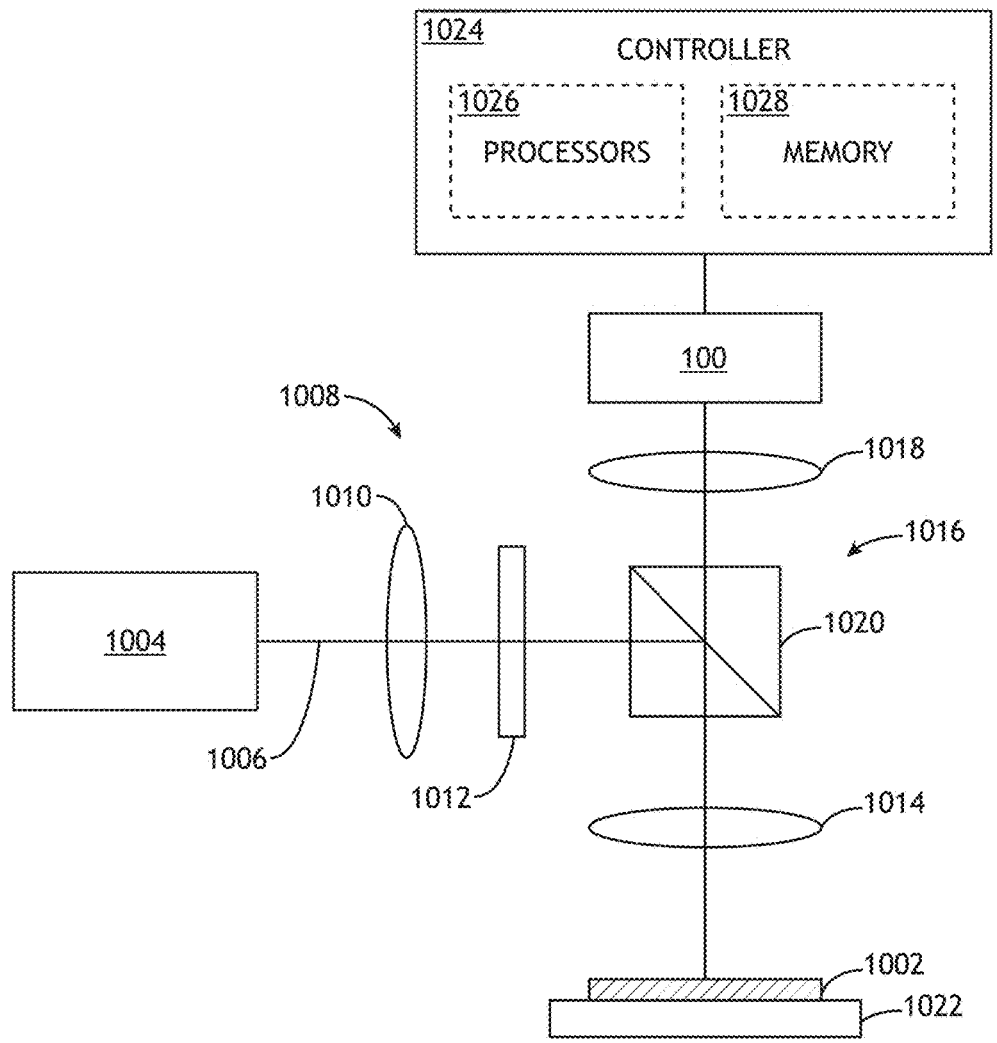
FIG. 10 is a conceptual view of a TDI sensor incorporated within an imaging system, in accordance with one or more embodiments of the present disclosure.

A TDI sensor 100 may be incorporated into a larger system for imaging a target object moving along the scan direction. FIG. 10 is a conceptual view of a TDI sensor 100 incorporated within an imaging system 1000, in accordance with one or more embodiments of the present disclosure. For example, the imaging system 1000 may be included within or form a part of a metrology system for determining one or more metrology measurements based on images generated by the imaging system 1000. In one embodiment, the imaging system 1000 is a defect detection system suitable for detecting one or more defects on a sample 1002 based on images of the sample generated by the TDI sensor 100.

In one embodiment, the imaging system 1000 includes an illumination source 1004 to generate an illumination beam 1006. The illumination beam 1006 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 1004 may further generate an illumination beam 1006 including any range of selected wavelengths. In another embodiment, the illumination source 1004 may include a spectrally-tunable illumination source to generate an illumination beam 1006 having a tunable spectrum.

The illumination source 1004 may further produce an illumination beam 1006 having any temporal profile. For example, the illumination source 1004 may produce a continuous illumination beam 1006, a pulsed illumination beam 1006, or a modulated illumination beam 1006. Additionally, the illumination beam 1006 may be delivered from the illumination source 1004 via free-space propagation or guided light (e.g. an optical fiber, a light pipe, or the like).

In another embodiment, the illumination source 1004 directs the illumination beam 1006 to the sample 1002 via an illumination pathway 1008. The illumination pathway 1008 may include one or more lenses 1010 or additional optical components 1012 suitable for modifying and/or conditioning the illumination beam 1006. For example, the one or more optical components 1012 may include, but are not limited to, one or more polarizers, one or more filters, one or more beam splitters, one or more diffusers, one or more homogenizers, one or more apodizers, or one or more beam shapers. By way of another example, the one or more optical components 1012 may include aperture stops to control the angle of illumination on the sample 1002 and/or field stops to control the spatial extent of illumination on the sample 1002. In another embodiment, the illumination pathway 1008 includes an aperture stop located in a plane conjugate to the back focal plane of the objective lens 1014 to provide telecentric illumination of the sample 1002.

In another embodiment, the imaging system 1000 includes an objective lens 1014 to focus the illumination beam 1006 onto the sample 1002.

In another embodiment, the imaging system 1000 includes a TDI sensor 100 configured to capture radiation emanating from the sample 1002 through a collection pathway 1016. For example, the collection pathway 1016 may include, but is not required to include, a collection lens (e.g. the objective lens 1014 as illustrated in FIG. 10) or one or more additional collection pathway lenses 1018 suitable for generating an image of the sample 1002 on the TDI sensor 100.

The collection pathway 1016 may further include any number of optical elements to direct and/or modify illumination collected by the objective lens 1014 including, but not limited to one or more collection pathway lenses 1018, one or more filters, one or more polarizers, or one or more beam blocks. Additionally, the collection pathway 1016 may include field stops to control the spatial extent of the sample imaged onto the TDI sensor 100 or aperture stops to control the angular extent of illumination from the sample used to generate an image on the TDI sensor 100. In another embodiment, the collection pathway 1016 includes an aperture stop located in a plane conjugate to the back focal plane of the objective lens 1014 to provide telecentric imaging of the sample 1002.

In one embodiment, as illustrated in FIG. 10A, the imaging system 1000 includes a beamsplitter 1020 oriented such that the objective lens 1014 may simultaneously direct the illumination beam 1006 to the sample 1002 and collect radiation emanating from the sample 1002. In this regard, the imaging system 1000 may be configured in an epi-illumination mode.

In another embodiment, the angle of incidence of the illumination beam 1006 on the sample 1002 is adjustable. For example, the path of the illumination beam 1006 through the beamsplitter 1020 and the objective lens 1014 may be adjusted to control the angle of incidence of the illumination beam 1006 on the sample 1002. In this regard, the illumination beam 1006 may have a nominal path through the beamsplitter 1020 and the objective lens 1014 such that the illumination beam 1006 has a normal incidence angle on the sample 1002. By way of another example, the angle of incidence of the illumination beam 1006 on the sample 1002 may be controlled by modifying the position and/or angle of the illumination beam 1006 on the beamsplitter 1020 (e.g. by rotatable mirrors, a spatial light modulator, a free-form illumination source, or the like). In another embodiment, the illumination source 1004 directs the one or more illumination beam 1006 to the sample 1002 at an angle (e.g. a glancing angle, a 45-degree angle, or the like).

In another embodiment, the sample 1002 is disposed on a sample translation device 1022. The sample translation device 1022 may include any device suitable for securing and translating the sample 1002 within the imaging system 1000. For example, the sample translation device 1022 may include any combination of linear translation stages, rotational stages, tip/tilt stages, belt systems, conveyor systems, or the like. In another embodiment, the sample translation device 1022 translates the sample 1002 along the scan direction 108 at a speed synchronized with the rate of charge transfer through the pixel array 102 of the TDI sensor 100.

In another embodiment, the imaging system 1000 includes a controller 1024. In another embodiment, the controller 1024 includes one or more processors 1026 configured to execute program instructions maintained on a memory medium 1028. In this regard, the one or more processors 1026 of controller 1024 may execute any of the various process steps described throughout the present disclosure.

In another embodiment, the controller 1024 is communicatively coupled to one or more elements of the imaging system 1000 to facilitate imaging of the sample 1002 with the TDI sensor 100. For example, the controller 1024 may be, but is not required to be, communicatively coupled to the TDI sensor 100 and/or the sample translation device 1022 to synchronize the charge transfer rate within the TDI sensor 100 to the translation velocity of the sample 1002. In one embodiment, the controller 1024 may receive a charge-transfer rate associated with clocking signals provided by a clock generator 110 and synchronize the translation velocity of the sample translation device 1022 accordingly. In another embodiment, the controller 1024 may adjust the charge transfer rate of the TDI sensor 100 (e.g., via the clock generator 110) to match the translation velocity of the sample translation device 1022. It may be the case that the charge transfer rate of the TDI sensor 100 may be more adjustable with a faster response time than the sample translation device 1022, which may be limited by the inertia of moving physical components, or the like. For example, the controller 1024 may compensate for fluctuations or variations of the translation velocity of the sample translation device 1022.

Further, the controller 1024 may be configured to receive data including, but not limited to, imaging data (e.g., line-scan images of the sample 1002) from the TDI sensor 100. Further, the controller 1024 may analyze or otherwise inspect the imaging data to determine the presence of defects on the sample 1002. For example, the controller 1024 may inspect a sample 1002 including an unpatterned wafer for defects. By way of another example, the controller 1024 may inspect a sample 1002 including a patterned device.

The one or more processors 1026 of a controller 1024 may include any processing element known in the art. In this sense, the one or more processors 1026 may include any microprocessor-type device configured to execute algorithms and/or instructions. In one embodiment, the one or more processors 1026 may consist of a desktop computer, mainframe computer system, workstation, image computer, parallel processor, or any other computer system (e.g., networked computer) configured to execute a program configured to operate the imaging system 1000, as described throughout the present disclosure. It is further recognized that the term "processor" may be broadly defined to encompass any device having one or more processing elements, which execute program instructions from a non-transitory memory medium 1028. Further, the steps described throughout the present disclosure may be carried out by a single controller 1024 or, alternatively, multiple controllers. Additionally, the controller 1024 may include one or more controllers housed in a common housing or within multiple housings. In this way, any controller or combination of controllers may be separately packaged as a module suitable for integration into imaging system 1000. Further, the controller 1024 may analyze data received from the TDI sensor 100 and feed the data to additional components within the imaging system 1000 or external to the imaging system 1000.

The memory medium 1028 may include any storage medium known in the art suitable for storing program instructions executable by the associated one or more processors 1026. For example, the memory medium 1028 may include a non-transitory memory medium. By way of another example, the memory medium 1028 may include, but is not limited to, a read-only memory, a random access memory, a magnetic or optical memory device (e.g., disk), a magnetic tape, a solid state drive and the like. It is further noted that memory medium 1028 may be housed in a common controller housing with the one or more processors 1026. In one embodiment, the memory medium 1028 may be located remotely with respect to the physical location of the one or more processors 1026 and controller 1024. For instance, the one or more processors 1026 of controller 1024 may access a remote memory (e.g., server), accessible through a network (e.g., internet, intranet and the like). Therefore, the above description should not be interpreted as a limitation on the present invention but merely an illustration.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A time delay and integration charge coupled device, comprising:
   an array of pixels distributed in a scan direction and a line direction perpendicular to the scan direction, wherein at least some of the pixels of the array include three or more gates aligned in the scan direction; and
   a clock generator configured to generate clocking signals to transfer charge along the scan direction between two or more pixel groups adjacent in the scan direction, wherein a pixel group of the pixel groups includes two or more pixels adjacent in the scan direction, wherein the clocking signals include phase signals to drive the gates of the two or more pixel groups, wherein the clocking signals generate a common potential well per pixel group for containing charge generated in response to incident illumination, wherein the clocking signals transfer the charge to an adjacent pixel group along the scan direction at a rate corresponding to a velocity of a target.

2. The time delay and integration charge coupled device of claim 1, wherein the clocking signals comprise:
   independent phase signals for the gates of the two or more pixels in the pixel groups.

3. The time delay and integration charge coupled device of claim 2, wherein a number of the independent phase signals equals a number of gates in each pixel group.

4. The time delay and integration charge coupled device of claim 1, wherein the pixels of the array include three gates aligned in the scan direction, wherein the two or more pixels of the pixel groups include two pixels, wherein the clocking signals comprises:
   six independent phase signals for the gates of the two pixels in the pixel groups.

5. The time delay and integration charge coupled device of claim 1, wherein the pixels of the array include three gates aligned in the scan direction, wherein the two or more pixels of the pixel groups include three pixels, wherein the clocking signals comprises:
   nine independent phase signals for the gates of the two pixels in the pixel groups.

6. The time delay and integration charge coupled device of claim 1, wherein the pixels of the array include four gates aligned in the scan direction, wherein the two or more pixels of the pixel groups include two pixels, wherein the clocking signals comprises:
   eight independent phase signals for the gates of the two pixels in the pixel groups.

7. The time delay and integration charge coupled device of claim 1, wherein the clocking signals minimize a net return current for the pixel groups within a selected tolerance.

8. The time delay and integration charge coupled device of claim 7, wherein the phase signals comprise:
   sinusoidal phase signals.

9. The time delay and integration charge coupled device of claim 7, wherein the pixels of the array include n gates, wherein the two or more pixels of the pixel groups include m pixels, wherein the clocking signals include phase signals, $V_k$, of the form $V_k = \sin(\omega t + 2\pi k/(m \cdot n))$ for $k = 0, 1, \ldots, m \times n - 1$.

10. The time delay and integration charge coupled device of claim 1, wherein a width of the common potential well has a width approximately equal to a single pixel of the array.

11. The time delay and integration charge coupled device of claim 1, further comprising:
    a shift register including a line of pixels distributed along the line direction, wherein at least some pixels of the shift register are configured to receive charge from the pixel groups in response to a cycle of the clocking signals; and
    a register signal generator configured to transfer charge from the shift register to an output amplifier to clear the shift register, wherein the register signal generator is configured to clear the shift register after each cycle of voltage signals.

12. The time delay and integration charge coupled device of claim 1, wherein the clock generator is further configured to dynamically adjust a number of pixels in the pixel groups.

13. The time delay and integration charge coupled device of claim 12, wherein the clock generator is further configured to dynamically adjust the number of pixels in the pixel groups to meet a power consumption specification.

14. The time delay and integration charge coupled device of claim 12, wherein the clock generator is further configured to dynamically adjust the number of pixels in the pixel groups to meet an imaging resolution specification.

15. An imaging system, comprising:
    an illumination source configured to generate an illumination beam;
    a sample translation device configured translate a target object along a scan direction;
    a set of illumination optics configured to direct the illumination beam to the target object disposed on the sample translation device;
    a time delay and integration detector, the detector comprising:
       an array of pixels distributed in the scan direction and a line direction perpendicular to the scan direction; and
       a clock generator configured to generate clocking signals to transfer charge along the scan direction between two or more pixel groups adjacent in the scan direction, wherein a pixel group of the pixel groups includes two or more pixels adjacent in the scan direction, wherein the clocking signals include phase signals to drive gates of the two or more pixel groups, wherein the clocking signals generate a common potential well per pixel group for containing charge generated in response to incident illumination from the target object, wherein the clocking signals transfer the charge to an adjacent pixel group along the scan direction at a rate corresponding to a velocity of the target object;
    a set of collection optics configured to generate an image of the target object on the detector in response to the incident illumination from the target object; and
    a controller communicatively coupled to the detector and the sample translation device, the controller including one or more processors configured to execute instructions configured to cause the one or more processors to synchronize the transfer of charge along the scan direction in the detector with motion of the target object along the scan direction.

16. The imaging system of claim 15, wherein synchronizing the transfer of charge along the scan direction in the detector with motion of the target object along the scan direction comprises:
    synchronizing, via the sample translation device, a translation velocity of the target object to the transfer of charge along the scan direction in the detector.

17. The imaging system of claim 15, wherein synchronizing the transfer of charge along the scan direction in the detector with motion of the target object along the scan direction comprises:
   synchronizing, via the detector, a rate of the transfer of charge along the scan direction in the detector to a translation velocity of the target object on the sample translation device.

18. The imaging system of claim 15, wherein the clocking signals comprise:
   independent phase signals for the gates of the two or more pixels in the pixel groups.

19. The imaging system of claim 18, wherein a number of the independent phase signals equals a number of gates in each pixel group.

20. The imaging system of claim 15, wherein the pixels of the array include three gates aligned in the scan direction, wherein the two or more pixels of the pixel groups include two pixels, wherein the clocking signals comprises:
   six independent phase signals for the gates of the two pixels in the pixel groups.

21. The time delay and integration charge coupled device of claim 15, wherein the clocking signals minimize a net return current for the pixel groups within a selected tolerance.

22. The time delay and integration charge coupled device of claim 21, wherein the phase signals comprise:
   sinusoidal phase signals.

23. The time delay and integration charge coupled device of claim 21, wherein the pixels of the array include n gates, wherein the two or more pixels of the pixel groups include m pixels, wherein the clocking signals include phase signals, Vk, of the form $Vk=\sin(\omega t+2\pi k/(m \cdot n))$ for k=0, 1, ..., m×n−1.

24. The imaging system of claim 15, wherein a width of the common potential well has a width approximately equal to a single pixel of the array.

25. The imaging system of claim 15, further comprising:
   a shift register including a line of pixels distributed along the line direction, wherein at least some pixels of the shift register are configured to receive charge from the pixel groups in response to a cycle of the clocking signals; and
   a register signal generator configured to transfer charge from the shift register to an output amplifier to clear the shift register, wherein the register signal generator is configured to clear the shift register after each cycle of voltage signals.

26. The imaging system of claim 15, wherein the clock generator is further configured to dynamically adjust a number of pixels in the pixel groups.

27. An imaging method, comprising:
   exposing an array of pixels distributed in a scan direction and a line direction perpendicular to the scan direction with illumination associated with a target travelling along the scan direction at a selected velocity, wherein at least some of the pixels of the array include three or more gates aligned in the scan direction; and
   generating clocking signals to transfer charge along the scan direction between pixel groups adjacent in the scan direction, wherein the pixel groups include two or more pixels adjacent in the scan direction, wherein the clocking signals include phase signals to drive the gates of the two or more pixels of the pixel groups, wherein the clocking signals generate a common potential well per pixel group for containing charge generated in response to the illumination, wherein the clocking signals transfer the charge to an adjacent pixel group along the scan direction at a rate corresponding to a velocity of a target.

28. The method of claim 27, wherein generating the clocking signals comprises:
   generating independent phase signals for the gates of the two or more pixels in the pixel groups.

29. The method of claim 28, wherein a number of the independent phase signals equals a number of gates in each pixel group.

30. The method of claim 27, wherein the pixels of the array include three gates aligned in the scan direction, wherein the two or more pixels of the pixel groups include two pixels, wherein the generating the clocking signals comprises:
   generating six independent phase signals for the gates of the two pixels in the pixel groups.

31. The method of claim 27, wherein the pixels of the array include three gates aligned in the scan direction, wherein the two or more pixels of the pixel groups include three pixels, wherein the generating the clocking signals comprises:
   generating nine independent phase signals for the gates of the three pixels in the pixel groups.

32. The method of claim 27, wherein the pixels of the array include four gates aligned in the scan direction, wherein the two or more pixels of the pixel groups include two pixels, wherein the generating the clocking signals comprises:
   generating eight independent phase signals for the gates of the two pixels in the pixel groups.

33. The method of claim 27, wherein the clocking signals minimize a net return current for the pixel groups within a selected tolerance.

34. The method of claim 33, wherein the phase signals comprise:
   sinusoidal phase signals.

35. The method of claim 33, wherein the pixels of the array include n gates, wherein the two or more pixels of the pixel groups include m pixels, wherein the clocking signals include phase signals, Vk, of the form $Vk=\sin(\omega t+2\pi k/(m \cdot n))$ for k=0, 1, ..., m×n−1.

36. The method of claim 27, wherein a width of the common potential well has a width approximately equal to a single pixel of the array.

37. The method of claim 27, further comprising:
   receiving, by pixels of a shift register distributed along the line direction, charge from the pixel groups in response to the clocking signals; and
   generating a register signal to transfer charge from the shift register to an output amplifier after a cycle of the clocking signals.

* * * * *

UNITED STATES PATENT AND TRADEMARK OFFICE
CERTIFICATE OF CORRECTION

| | |
|---|---|
| PATENT NO. | : 10,469,782 B2 |
| APPLICATION NO. | : 15/713003 |
| DATED | : November 5, 2019 |
| INVENTOR(S) | : David L. Brown |

It is certified that error appears in the above-identified patent and that said Letters Patent is hereby corrected as shown below:

In the Claims

Column 21, Line 22 should read:
--The imaging system--

Column 21, Line 26 should read:
--The imaging system--

Signed and Sealed this
Seventeenth Day of March, 2020

Andrei Iancu
*Director of the United States Patent and Trademark Office*